United States Patent [19]
Dunstan

[11] Patent Number: 5,541,489
[45] Date of Patent: Jul. 30, 1996

[54] SMART BATTERY POWER AVAILABILITY FEATURE BASED ON BATTERY-SPECIFIC CHARACTERISTICS

[75] Inventor: Robert A. Dunstan, Beaverton, Oreg.

[73] Assignee: Intel Corporation, Santa Clara, Calif.

[21] Appl. No.: 356,906

[22] Filed: Dec. 15, 1994

[51] Int. Cl.$^6$ .............................. H01M 10/44; H02J 7/04
[52] U.S. Cl. ...................... 320/2; 320/5; 320/48
[58] Field of Search .............................. 320/5, 2, 20, 13, 320/11, 22, 29, 24, 30, 46, 48

[56] References Cited

U.S. PATENT DOCUMENTS

| | | | |
|---|---|---|---|
| 4,709,202 | 11/1987 | Koenck et al. | 320/43 |
| 4,918,368 | 4/1990 | Baker et al. | 320/40 |
| 5,315,228 | 5/1994 | Hess et al. | 320/31 |

*Primary Examiner*—Peter S. Wong
*Assistant Examiner*—Gregory J. Toatley, Jr.
*Attorney, Agent, or Firm*—Blakely, Sokoloff, Taylor & Zafman

[57] ABSTRACT

A smart battery that predicts whether or not a battery can provide a requested amount of additional power based on battery-specific capacity, self-discharge, and discharge characteristics. A non-volatile memory stores the battery-specific characteristics which are functions of the environmental conditions of the battery and/or the battery current. One circuit measures the environmental conditions of the battery, such as temperature. Another circuit measures the battery current (charge or discharge). In response to a request, the smart battery determines whether or not the additional power can be provided based on the present battery capacity, the present discharge rate of the battery, the environmental conditions of the battery, and the battery characteristics. A user or power management system can use such power availability information to tune the power consumption and performance of an electronic system powered by the battery.

32 Claims, 11 Drawing Sheets

SMART BATTERY POWER AVAILABILITY FEATURE BASED ON BATTERY-SPECIFIC CHARACTERISTICS

RELATED APPLICATIONS

This patent application is related to the following patent applications which are assigned to the assignee of the present invention and filed concurrently herewith: patent application Ser. No. 08/357,412, entitled "Smart Battery Providing Programmable Remaining Capacity And Run-Time Alarms Based On Battery-Specific Characteristics, patent application Ser. No. 08/356,905, entitled "Smart Battery Providing Battery Life And Recharge Time Prediction," and patent application Ser. No. 08/356,719, entitled "Smart Battery Charger System."

BACKGROUND OF THE INVENTION

1. Field of the Invention

The present invention relates generally to batteries, and more specifically to rechargeable batteries that have electronics for predicting whether or not a battery can provide a requested amount of additional power based on battery-specific characteristics.

2. Related Art

Rechargeable batteries are used in many of today's portable electronic devices, such as computers, camcorders, and cellular phones. Typically, these electronic devices are also capable of utilizing AC power. Battery power is utilized when AC power is not convenient or is not available.

It is often important to provide accurate information regarding the remaining capacity of the battery. Some batteries provide a "fuel gauge" that gives an indication of the charge level of the battery. For example, U.S. Pat. No. 5,315,228 (the '228 patent) describes a rechargeable battery that measures battery discharge current and estimates battery self-discharge to predict the remaining capacity of the battery (:i.e., how full the "tank" is to continue the analogy of the "fuel gauge"). Self-discharge refers to a loss in battery capacity that occurs even when the battery is not supplying any discharge current to a load. The '228 patent describes self-discharge as being estimated from experimental observations of battery self-discharge. For example, in the '228 patent a fully charged Ni-MH (nickel metal hydride) battery is estimated to self-discharge at a rate of approximately 6% the first 6 hours and a Ni-Cd (nickel cadmium) battery is estimated to self-discharge at a rate of 3% the first six hours. Both batteries are estimated to self-discharge at rates of about 1.5% the second six hour period, about 0.78% the third and fourth six hour periods, and approximately 0.39% for each subsequent six hour period. For partially discharged batteries, self-discharge is estimated to be about 0.39% for each six hour period. (See column 12, line 59—column 14, line 4.)

However, this approach for predicting battery capacity does not account for the dependence of self-discharge or battery capacity on environmental conditions, such as battery temperature. FIGS. 1A and 1B illustrate typical self-discharge characteristics as a function of temperature for rechargeable batteries. In certain situations, the '228 patent's method for estimating self-discharge can produce unacceptable errors in the "fuel gauge" remaining capacity indication. Under high temperature conditions, the self-discharge can be much greater than the estimated values. For example, one scenario could include a video camcorder and battery being stored in a car on a series of hot, sunny days, causing the battery's "fuel gauge" to erroneously indicate more than enough charge to film a 20-minute wedding ceremony. The scenario concludes with an irate father when his camcorder shuts off 10 minutes into the ceremony, without a spare battery.

To provide warning of low battery conditions, some computer systems provide a run-time alarm that indicates when the battery has less than a fixed amount of time remaining at the present discharge rate. In other words, the alarm is triggered if:

(estimated battery capacity/present discharge rate)<fixed alarm time.

The above-described "fuel gauge" is used to indicate battery capacity for this run-time alarm. This type of ran-time alarm has several drawbacks in computer systems. First, the present discharge rate does not adequately reflect the dynamic discharge rates in the computer. For example, in today's laptop and notebook computers, power consumption varies dynamically, on the order of several hundred milliamps (mA). This variation is due to power management systems that turn on and off the hard-disk, LCD screen backlight, CPU, etc., under various conditions to save power. Second, the battery capacity provided by the above "fuel gauge" is inaccurate because the dependence of self-discharge on environmental factors, such as temperature, humidity, air pressure, is not considered. Third, the alarm value is fixed. This removes flexibility from the power management system for adjusting the alarm value to the varying power conditions in the system.

Another drawback of today's rechargeable batteries is they do not provide the systems they power with an indication of whether there is enough power remaining to perform a given task, i.e., the power availability of the battery. Although the above "fuel gauge" provides some indication of a battery's remaining capacity, it does not provide specific information about whether the battery can provide a specified amount of additional power to perform a task. For example, near total discharge, a laptop computer may need to know whether there is sufficient battery power available to spin-up the hard disk to save a file before saving the state of the machine and powering down. What the computer needs to know is whether the battery is capable of providing the power for the additional task without the battery's terminal voltage dropping below a cut-off value.

Yet another drawback of today's rechargeable batteries is that they do not provide an accurate indication of remaining battery life based on a user-specified discharge rate. The prior "fuel gauge" gives an estimate of the amount of remaining charge in the battery based on the present discharge rate, but provides no indication regarding how long the battery will continue to provide power at other discharge rates. The battery does not tell the user, and the user cannot ask the battery, how long the battery will continue to supply power if the discharge rate is varied. In addition, neither the above "fuel gauge" nor rim-time alarm account for the effect of environmental conditions or large battery loads on battery capacity.

Charging is another key aspect of rechargeable batteries. Various methods for charging batteries are known, such as quick charging and trickle charging. With respect to recharge time, the general goal is to charge the battery as quickly as possible without damaging the battery. Charging may cause the battery to heat up. Overheating during charging may damage the battery. For some batteries, such as Ni-Cd, one way of avoiding battery damage during charging is to monitor battery temperature and switch from quick charging to trickle charging if the temperature exceeds a safe level. Such efforts can prevent damage to the battery, but do not necessarily optimize the charging of the battery. For example, minimizing charge time while avoiding destructive conditions may optimize recharge time at the expense of reducing the total number of charge/discharge cycles the battery can provide. Thus, the overall useful life of the battery would be reduced.

Typical battery chargers are designed for use with a specific type of battery. For example, a charger may be designed specifically for charging Ni-Cd batteries, which are charged with a specific constant current, voltage limit, and end-of-charge criteria. However, ongoing improvements to Ni-Cd batteries, such as changes in battery chemistry or cell design, may require that newer Ni-Cd batteries be optimally charged at a different constant current and/or different voltage limit, not provided by the original charger. In addition, charging conditions vary with battery type. For example Ni-MH and Ni-Cd batteries are typically charged at a constant current with a voltage limit. Some lithium-ion and lead-acid batteries are charged at a constant voltage with a current limit. Today's battery chargers are not capable of dynamically adapting to meet the various charging needs of different types of batteries, different battery chemistries, and different battery cell designs. Nor are today's battery chargers capable of adapting to meet changing charging needs as battery chemistries and cell designs change over time.

Another drawback of present battery charging techniques is that no accurate indication is provided as to how long it will take to fully charge the battery from its present capacity. For example, it would be advantageous to know how long it will take to charge a battery that is presently at half capacity.

In summary, rechargeable batteries, such as those used in today's electronic equipment such as laptop computer systems, cellular telephones and video cameras, presently pose a number of problems from both the user's and the equipment's perspective. First, they represent an unpredictable source of power. Typically a user has little advance knowledge that their battery is about to run out or how much operating time is left. Second, equipment powered by the battery can not determine if the battery, in its present state, is capable of supplying adequate power for an additional load (such as spinning up a hard disk). Third, battery chargers must be individually tailored for use with a specific battery chemistry and cell design and may cause damage if used on another battery with a different chemistry or cell design.

Therefore, a smart battery that can predict whether or not the battery can provide a desired amount of additional power based on battery-specific characteristics is needed.

SUMMARY OF THE INVENTION

The present invention covers a method and apparatus for predicting whether or not a battery can provide a requested amount of additional power based on battery-specific characteristics.

In one embodiment, the apparatus of the present invention predicts whether or not the battery is capable of providing a requested amount of power. The apparatus includes a logic unit and a memory storing one or more characteristics of the battery. The battery characteristics are a function of one or more environmental conditions of the battery and/or a battery current. The logic unit determines and indicates whether or not the battery can provide the requested amount of power based on present battery capacity, the environmental conditions, and the battery characteristics. The requested amount of power may also be an amount of power in addition to an existing amount of power being supplied by the battery. In this case the logic unit bases its prediction on a present discharge rate of the battery.

In another embodiment, the apparatus of the present invention predicts whether or not the battery is capable of providing a requested amount of additional power in addition to the amount of power the battery is presently providing.

BRIEF DESCRIPTION OF THE DRAWINGS

The present invention is illustrated by way of example and not limitation in the figures of the accompanying drawings, in which like references indicate similar elements.

FIG. 5A illustrates that battery capacity may be dependent on discharge rate.

DETAILED DESCRIPTION OF THE PRESENT INVENTION

A method and apparatus for a smart battery that can predict whether or not the battery can provide a requested amount of additional power based on battery-specific characteristics is described. In the following description, numerous specific details such as currents, voltages, temperatures, power, and battery characteristics are set forth in order to provide a thorough understanding of the present invention. It will be apparent, however, to one skilled in the art that the present invention may be practiced without these specific details. In other instances, well-known methods and circuits are shown in block diagram form in order not to obscure the present invention.

Figure 1A:
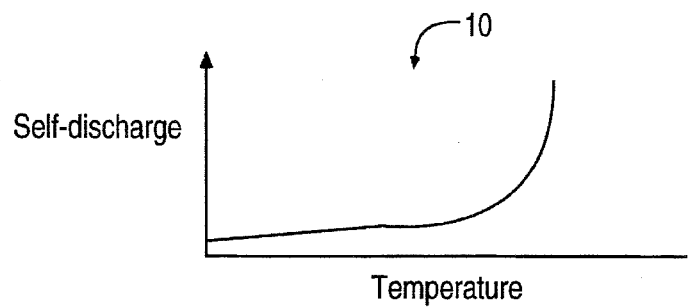
FIG. 1A illustrates an exemplary self-discharge current characteristic as a function of temperature for a rechargeable battery.
Figure 1B:
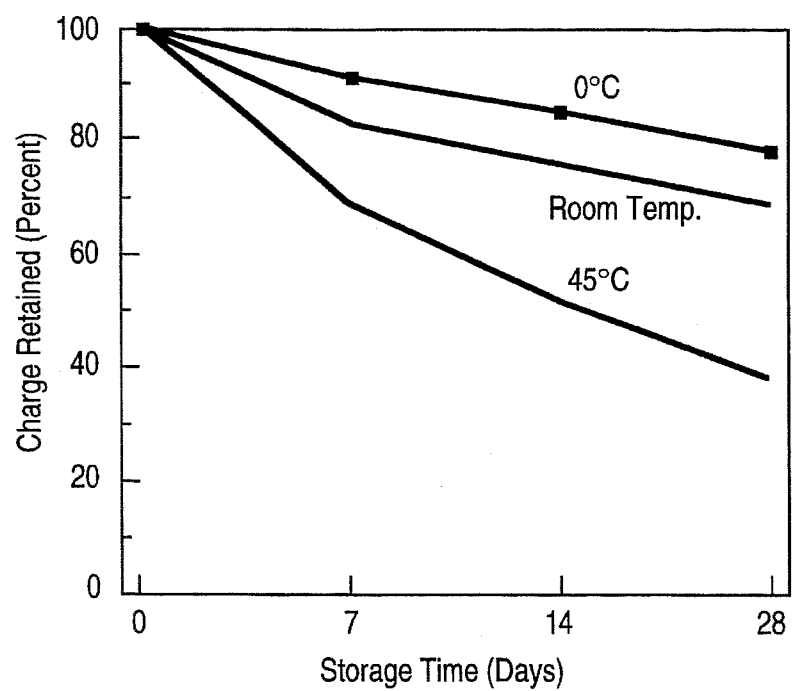
FIG. 1B illustrates another exemplary self-discharge characteristic for a specific battery chemistry showing retained charge as a function of time for various temperatures.
Figure 2:
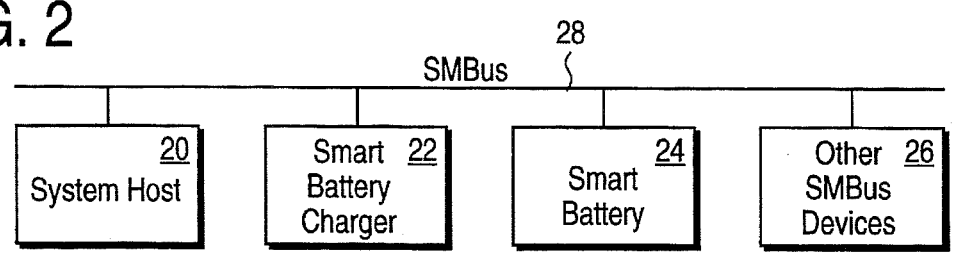
FIG. 2 is a block diagram of one embodiment of a smart battery system.

FIG. 2 is a block diagram of one embodiment of a smart battery system of the present invention. A system host 20, a smart battery charger 22, a smart battery 24, and other SMBus devices 26 are coupled to a System Management Bus (SMBus) 28. SMBus 28 provides communication and signaling between the devices coupled to it. Smart battery 24 can provide system host 20 and smart battery charger 22 with present capacity and charging information. System host 20 gets and reports to the user information such as remaining battery capacity, how much battery operating time is left, and whether the battery can provide adequate power for an additional load. In addition, the system provides for optimal charging of smart battery 24. SMBus devices 26 represent other smart electronic devices that communicate over SMBus 28. For example, the back-light controller in a notebook computer can be implemented as smart device and controlled by the system's power management scheme.

Figure 3:
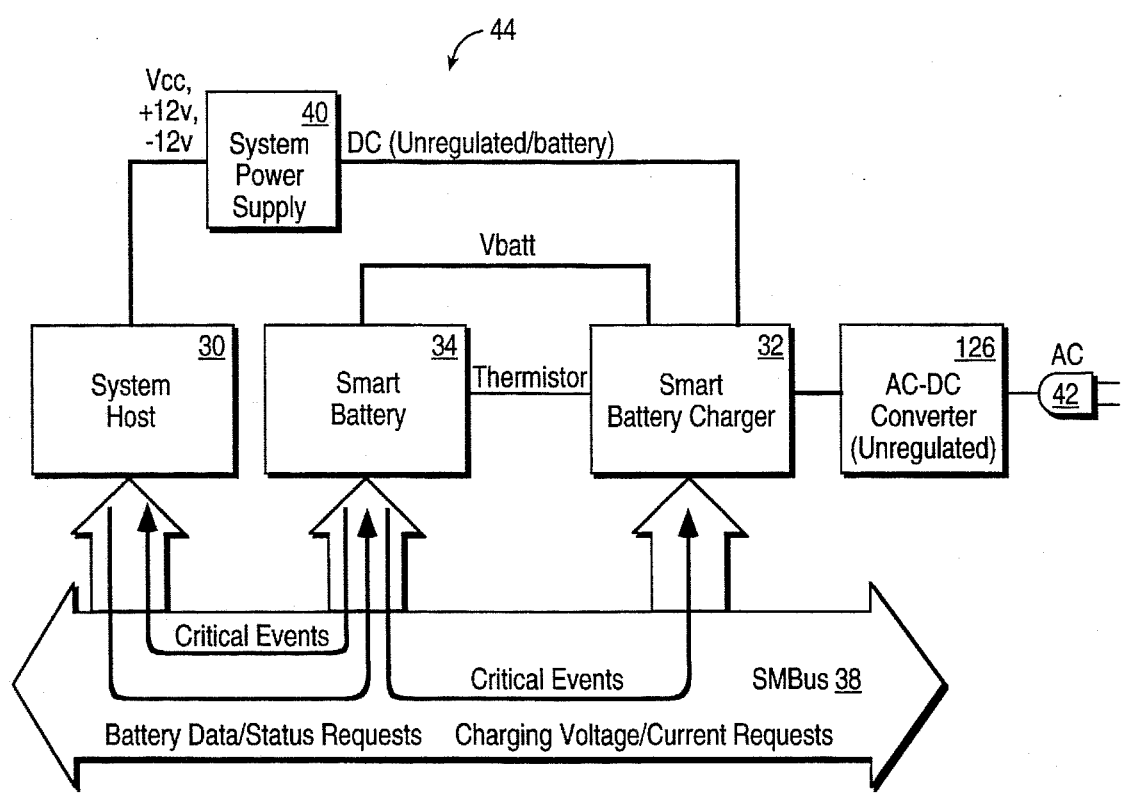
FIG. 3 is a block diagram of another embodiment of a smart battery system.

FIG. 3 is a block diagram of another embodiment of a smart battery system 44 of the present invention. A System Management Bus (SMBus) 38 provides communication and signaling between devices according to a defined protocol. In one embodiment, the protocol of the SMBus 38 is based on the $I^2C$-bus protocol, developed by Philips. $I^2C$ is a two-wire bus protocol designed for data transport between low-speed devices. A system host 30, a smart battery charger 32, and a removable smart battery 34 are coupled to the SMBus 38.

Smart battery 34 is a rechargeable battery that is equipped with electronics to provide present capacity and charging information about the battery to system host 30 and smart battery charger 32. The electronics can be embedded in the battery pack, or exist outside the battery pack. Wherever located, the electronics must be able to measure the environmental conditions of the smart battery 34. Smart battery 34 maintains information regarding its enviromnent, charging characteristics, discharge characteristics, self-discharge characteristics, capacity characteristics, present capacity, and total capacity. This battery-specific information may be stored with, or separate from, smart battery 34, but must be battery-specific. Typically the battery-specific information is maintained within smart battery 34. The characteristics stored may be functions of temperature, battery current, battery voltage, environmental conditions, or other variables affecting battery performance. The battery characteristics may be stored in the form of tables, formulas, or algorithms that represent the characteristics of the battery. Environmental information tracked by smart battery 34 may include battery temperature, humidity, air pressure, or other conditions that influence battery performance and/or capacity. Smart battery 34 may also include programmable alarm values for events, such as over-charge, over-voltage, over-temperature, temperature increasing too rapidly, remaining run-time and remaining capacity.

Based on the battery-specific characteristics, measured environmental conditions, measured battery current, and battery history (battery capacity can be affected by the charge/discharge history of the battery), smart battery 34 can accurately determine present battery capacity. Based on the present battery capacity, smart battery 34 can predict remaining battery run-time based on either the present discharge rate or a user-supplied discharge rate. Similarly, smart battery 34 can determine whether an amount of power can be supplied. The amount of power can either be a total amount of power or an amount of power in addition to that already being supplied by the smart battery 34. Similarly, smart battery 34 can also determine its optimal charging voltage and charging current. In summary, based on battery-specific characteristics, measured battery conditions, and present battery capacity, smart battery 34 can accurately determine remaining battery life, power availability, and optimal charging conditions. Smart battery 34 can provide this information to the system host 30 and the smart battery charger 32 to provide users with useful battery information, improve system power management, optimize battery charging, and maximize battery life.

It is advantageous that smart battery 34 maintain its own information because batteries, each being unique, are frequently changed in a system. A good example is a video camcorder where a user may have multiple batteries each with different design capacities, chemistries, and charge states. Even with an accurate state-of-charge indication, a full one AH (ampere hour) battery is not equivalent to a full 1.5 AH battery. Though they both can power the same camcorder, what the user warns to know is whether or not either of these batteries has adequate capacity to record a one-hour event. Smart battery 34 provides the user with accurate remaining capacity information along with an accurate prediction of the remaining operating time.

Another advantage is that smart battery 34 provides information for power management and charge control regardless of the particular battery's chemistry or construction. System host 30 can use the battery-specific power information to better manage the power consumption of the system. Smart battery charger 32 can use the battery-specific charging information to optimize the charging of smart battery 34.

System host 30 is a piece of electronic equipment powered by smart battery 34. For example, system host 30 could be a notebook computer, video camera, or cellular phone. System host 30 can communicate with smart battery 34 via SMBus 38 to request information from smart battery 34. System host 30 then uses the battery information in the system's power management scheme and/or uses it to provide the user with information about the smart battery's 34 present state and capabilities. System host 30 also receives critical events from smart battery 34 when smart battery 34 detects a problem. These critical events may include capacity alarm and run-time alarm signals sent to the system host 30. They may also include alarms sent to smart battery charger 32.

Smart battery charger 32 is a battery charger that periodically communicates with smart battery 34 and alters its charging outputs (such as charging voltage and/or current) in response to information provided by smart battery 34. Smart battery charger 32 may be implemented at various levels. A level 1 smart battery charger 32 provides fixed charging outputs that are altered in response to critical alarm messages from the smart battery 34. A level 2 smart battery charger 32 alters the charging voltage and/or charging current in response to charging instructions frown smart battery 34 and also responds to critical alarm messages. A level 3 smart battery charger 32 periodically polls smart battery 34 for charging information and may adjust its charging outputs accordingly. A level 3 smart battery charger 32 may also ignore the battery's charging requests and use its own charging algorithm, such as a specific charging pattern. Level 3 smart battery chargers may also respond to critical alarm messages. Level 1, 2, and 3 smart battery chargers are described further below. In summary, smart battery charger 32 periodically receives information from smart battery 34 indicating how smart battery 34 would like to be charged. Smart battery 34 determines optimal charging conditions based on the smart battery's 34 charging characteristics, present charge level, and environmental conditions. Smart battery charger 32 may adjust its charging voltage and/or charging current in response to the desired charging voltage and desired charging current information received from the smart battery 34.

Thus, smart battery 34 can control its own charge cycle to optimize charge time, prolong battery life, and prevent destructive charging conditions. Charging time can be optimized by adjusting charging according to the smart battery's 34 specific charging characteristics. The life of smart battery 34 can be prolonged by avoiding charging conditions that shorten battery life. For example, repeated short discharge/charge cycles or overcharging can shorten battery life. Smart battery 34 may determine that charging is not desirable if present charge capacity is, for example, already above 85%. Smart battery charger 32 can avoid destructive charging conditions by stopping or altering charging when smart battery 34 detects critical events such as: over-charge, over-voltage, over-temperature or temperature increasing too rapidly.

AC-DC converter 36 converts AC power received from AC plug 42 to DC power. System power supply 40 receives DC power from either smart battery 34 or AC-DC converter 36 and generates a variety of DC voltages for system host 30. Vbatt represents the battery voltage provided between the POSitive and NEGative battery terminals. Many electronic systems require voltages of $V_{CC}$ (typically 5.0 and/or 3.3 volts), +12 volts, and −12 volts. The thermistor is a temperature sensor for sensing battery temperature. The temperature sensor may also be used to provide an independent safety mechanism and/or to signal a "default" charging algorithm.

The communication events that can occur within the smart battery system 44 can be divided into several types, including but not limited to: 1) system host 30 to smart battery 34, 2) smart battery 34 to system host 30, 3) smart battery 34 to smart battery charger 32, 4) smart battery charger 32 to smart battery 34, and 5) system host 30 to smart batter charger 32.

Communication between system host 30 and smart battery 34 can be used to get data for either a user or the system host's 30 power management system. The user can get three types of data from the battery: characteristic data, measured data, and calculated data. Characteristic data includes battery characteristics, such as pack design voltage, pack design capacity, and charging and capacity characteristics as a function of the battery's environmental conditions. Measured data is data that is measured, such as battery temperature. Calculated data is data that is determined based on characteristic data and measured data. For example, self-discharge data is determined based on measured environmental conditions and a battery's self-discharge characteristics. Additionally, since the smart battery 34 has a clock, timer, or other means for tracking time, the information can be presented as a rolling average over a fixed interval. The clock also allows the battery to periodically track its environment over time.

The system host's 30 power management system may query a device driver to determine if an action will cause harm to the system's integrity. For example, spiraling up a disk drive at the end of the battery's charge might cause its output voltage to drop below acceptable limits thus causing a system failure. In order to prevent this, the device driver needs information from the battery that will allow it to do the right thing. If the driver queries the battery and discovers that not enough power is available, the driver can request that the power management system turn off a non-critical power use such as the LCD screen back-light and then try again. The driver could also disallow the action and/or request that the user plug in AC power.

In summary, communication between system host 30 and smart battery 34 may be performed: to allow the user to know the smart battery's 34 remaining life; to tell the user how long it will take to charge smart battery 34; to allow smart battery 34 to provide accurate battery information to the user; to determine the system host's 30 real-time power requirements; to enable power management based on "real" information supplied by the battery; to enable battery manufacturers to collect information about a smart battery's 34 usage; and to allow battery manufacturers to electronically "stamp" batteries at time of manufacture.

Communication between smart battery charger 32 and smart battery 34 can be performed: to allow smart battery 34 to be charged as rapidly and as safely as possible, to allow new and different battery chemistries and cell constructions to be used, to allow access to the "correct" charging algorithm for the battery, and to allow smart battery 34 to be charged in a way that maximizes the life of smart battery 34.

Communication between smart battery 34 and smart battery charger 32 and/or system host 30 can be performed: to allow smart battery 34 to warn other system components of potential problems, to allow smart battery 34 to warn the user, power management system, or smart battery charger 32 about potentially dangerous situations that the user can rectify, and to allow smart battery 34 to instruct the smart battery charger what charge current and charge voltage to generate.

Figure 4:
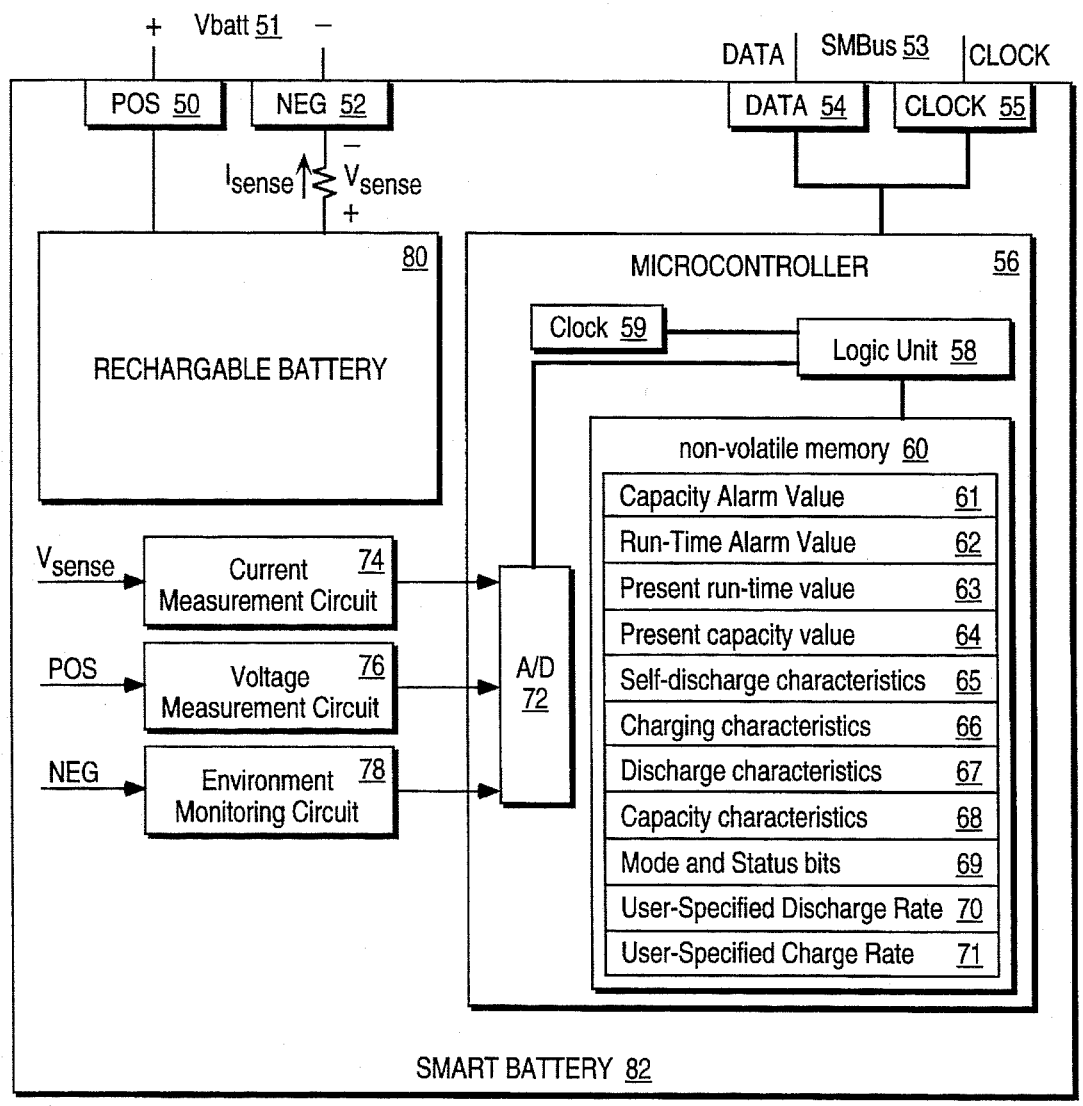
FIG. 4 is a block diagram of one embodiment of a smart battery.

FIG. 4 is a block diagram of one embodiment of the smart battery of the present invention. Smart battery 82 includes rechargeable battery 80 and other electronic circuitry. The electronic circuitry may or may not be physically embedded in the same battery pack as rechargeable battery 80. Wherever located, the electronic circuitry must be able to measure the environmental conditions of the smart battery 82 and contain, or store, the battery-specific characteristics of that smart battery (i.e., the stored battery characteristics must be battery-specific). Rechargeable battery 80 provides the electrical power of smart battery 82. Rechargeable battery 80 may include one or more battery cells that are connected in either a series, parallel, or series/parallel combination to form a battery pack. For example, ten battery cells, each having a cell voltage of 1.2 volts, can be connected in series such that rechargeable battery 80 provides a voltage of 12.0 volts. POS 50 and NEG 52 are the positive and negative power terminals, respectively, of smart battery 82 that together provide the voltage $V_{BATT}$ 51. DATA 54 and CLOCK 55 are data and clock terminals, respectively, that provide a communication interface to the DATA and CLOCK lines, respectively, of SMBus 53. Other communication interfaces, such as a single-wire interface, may also be used with the smart battery.

Microcontroller 56 includes a logic unit 58, a non-volatile memory 60, a clock 59, and an analog-to-digital (A/D) converter 72. Logic unit 58 may be a CPU, processor, or random logic that performs the smart battery functions.

Non-volatile memory 60 may comprise flash, ROM, EPROM, EEPROM, and other types of non-volatile memory (non-volatile meaning it retains stored values even in the absence of electrical power). Volatile memory, such as SRAM or DRAM memory, may also be used in other embodiments. Non-volatile memory 60 stores a capacity alarm value 61, a run-time alarm value 62, a present run-time value 63, a present capacity value 64, one or more self-discharge characteristics 65, one or more charging characteristics 66, one or more discharge characteristics 67, one or more capacity characteristics 68, mode and status bits 69, a user-specified discharge rate 70, and a user-specified charge rate 71. In one embodiment, battery characteristics 65–68 are stored in a ROM memory while alarm values 61–62, run-time and capacity values 63–64, mode and status bits 69, user-specified discharge rate 70, and user-specified charge rate 71 are stored in a non-volatile memory that is both readable and writeable, such as flash or EEPROM memory. Microcontroller 56 may also include RAM memory. Characteristics 65–68 may be stored in the form of tables of data, formulas, or algorithms, representing the various battery characteristics. Clock 59 is a digital timer, counter, or clock that provides logic unit 58 with elapsed time information. Clock 59 can also generate interrupts to cause logic unit 58 to perform actions, such as periodically updating the present capacity value 64. A/D converter 72 converts analog signals produced by a current measurement circuit 74, a voltage measurement circuit 76, and an environment monitoring circuit 78 into digital form for use by logic unit 58.

Current measurement circuit 74 measures the actual current (charge or discharge) of rechargeable battery 80. Current measurement circuit 74 receives a voltage, $V_{sense}$, developed across a small resistor (e.g., 0.01 Ω) that is coupled between the NEG 52 battery terminal and rechargeable battery 80. The $V_{sense}$ voltage is directly proportional to a current $I_{sense}$, which is the actual charge/discharge current of the smart battery 82. The current measurement circuit 74 generates an analog output voltage proportional to the measured charge/discharge current. Current measurement circuit 74 provides appropriate scaling of the voltage input to A/D converter 72. Circuits for measuring current are well-known in the art. Voltage measurement circuit 76 measures the actual terminal voltage of rechargeable battery 80 and produces an analog output proportional to the measured terminal voltage. Voltage measurement circuit 76 provides appropriate scaling of the terminal voltage for input to A/D converter 72. Environment monitoring circuit 78 measures the environmental conditions of smart battery 82, such as battery temperature, humidity, altitude, or other conditions affecting battery characteristics. Environment monitoring circuit 78 may include a temperature sensor, such as a thermistor, a thermocouple, a semiconductor temperature sensor, or other temperature sensing device, that produces an analog signal proportional to the sensed temperature. Again, appropriate amplifier/offset circuitry for scaling the analog signal for input to A/D converter 68 is provided. Environment monitoring circuit may sense conditions of the battery cells of rechargeable battery 80 or conditions of the smart battery 82 (i.e., the battery pack).

Logic unit 58 receives the smart battery's 82 current, voltage, and battery environment information from A/D converter 72 and the battery characteristics from non-volatile memory 60. Based on this information, the logic unit 58 can determine present battery capacity, power availability, predicted run-time, predicted recharge time, and optimal charging conditions.

Figure 5B:
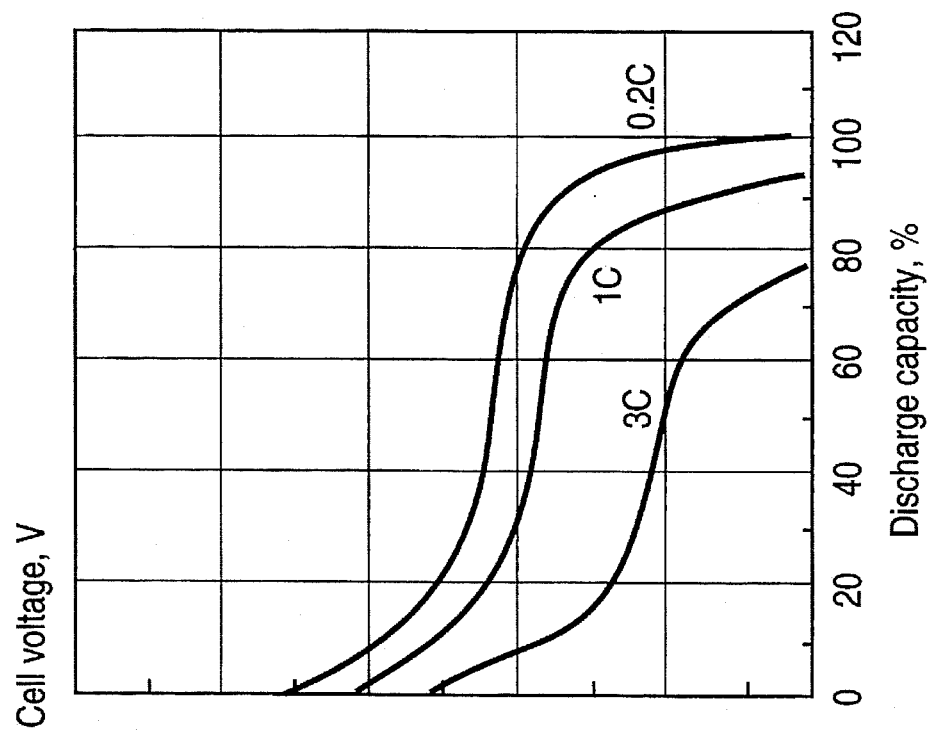
FIG. 5B is a graph, for a particular cell design and chemistry, of a battery's capacity as a function of temperature for various load currents.
Figure 5A:
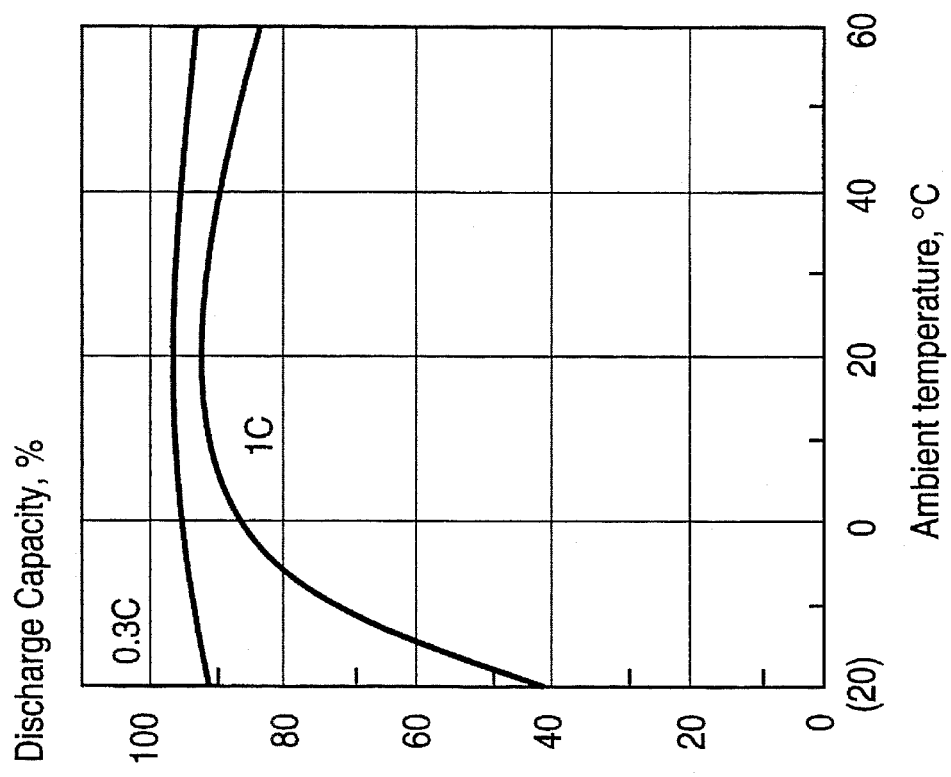
FIG. 5A is a graph, for a particular cell design and chemistry, of battery cell voltage as a function of discharge rate for various load currents.

FIG. 5A is a graph of battery cell voltage as a function of discharge capacity for load currents of 3 C, 1 C, and 0.2 C for a particular battery. The graph illustrates that a higher discharge current reduces the cell voltage. The graph also shows that higher discharge current reduces the capacity of the battery. This is one of the battery characteristics that may be stored in non-volatile memory 60 of FIG. 4. Note that C is a unit indicating battery capacity. By convention, battery capacity is interpreted at a C/5 discharge rate. For example, a battery having a capacity of 2 AH (C) means the battery can provide a current of 400 mA for 5 hours (2 ampere-hours/5 hours).

FIG. 5B is a graph of a particular battery's discharge capacity as a function of temperature for discharge currents of 0.3 C and 1 C. This battery characteristic illustrates the dependency of battery capacity on temperature and load current.

Figure 6:
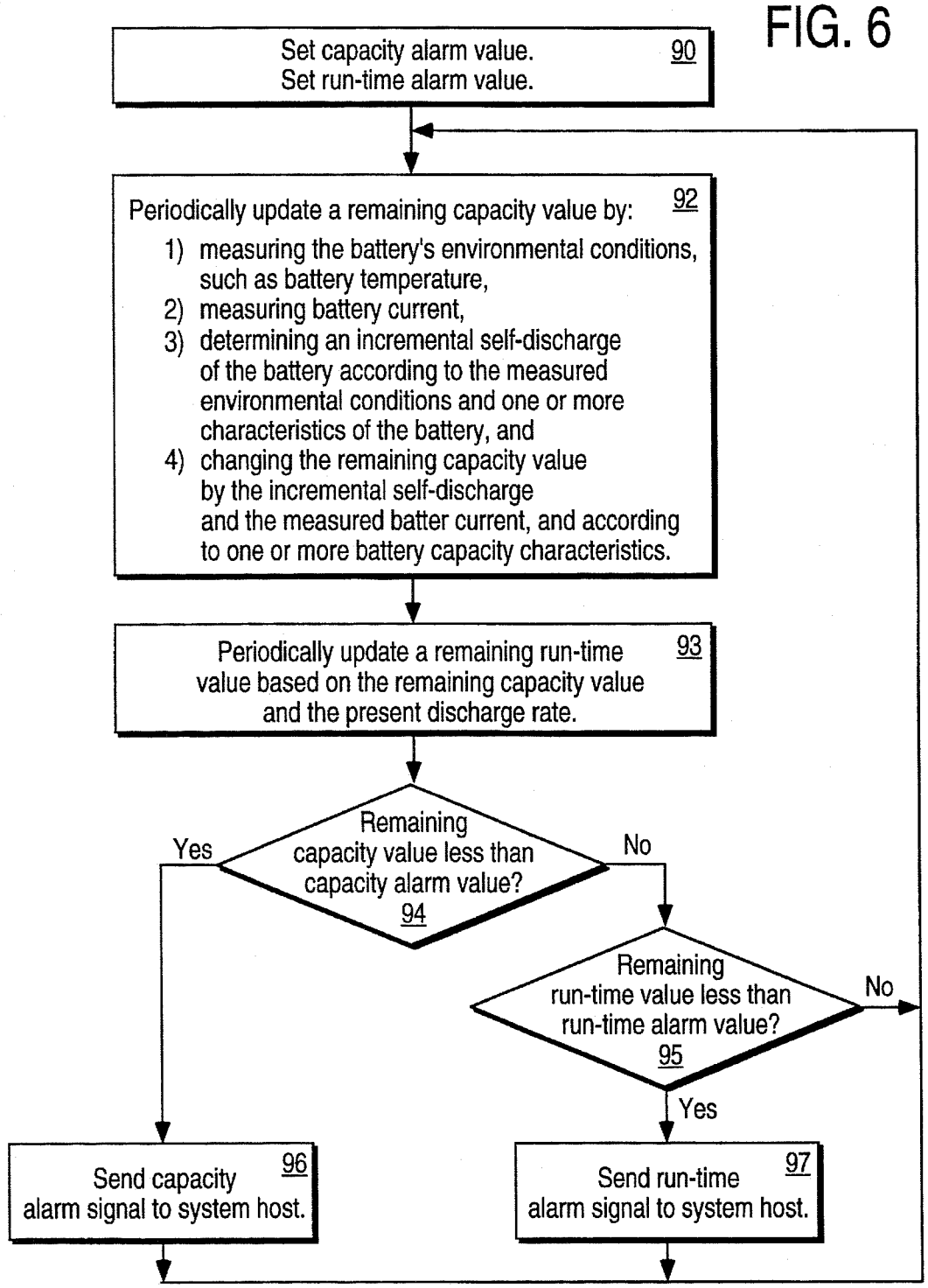
FIG. 6 is a flowchart of the present invention method for a programmable remaining capacity alarm and programmable remaining run-time alarm.

FIG. 6 is a flowchart of a method for a programmable remaining capacity alarm and programmable remaining run-time alarm based on battery-specific characteristics. At step 90, the capacity alarm value and run-time alarm value are set to specified values by the user, the power management system, or by other means. For example, a user may program the capacity alarm value to trigger the remaining capacity alarm when the battery has 10% remaining capacity and program the run-time alarm value to trigger the remaining run-time alarm when the battery is predicted to have a remaining life of 5 minutes. In one embodiment, the alarms are set by writing data to certain locations in the smart battery's memory. In a smart battery system such as that of FIG. 3, the system host can set the alarms of the smart battery via the SMBus.

At step 92, a remaining capacity value of the battery is periodically updated by: 1) measuring the battery's environmental conditions, such as battery temperature, 2) measuring actual battery current, 3) determining an incremental self-discharge of the battery (the incremental self-discharge is determined from one or more of the battery's characteristics and the measured environmental conditions of the battery, and 4) changing the remaining capacity value by the incremental self-discharge and the measured battery current. In one embodiment, the incremental self-discharge is based on the battery's self-discharge characteristic and the measured temperature of the battery. In addition, the battery's capacity characteristic can be taken into account when updating the remaining capacity value. The battery's capacity characteristic is an indicator of how the battery's capacity changes with temperature and/or other battery conditions. In particular, the battery's capacity characteristics may be functions of environmental conditions and/or the battery current. The remaining capacity value is an accurate indication of the remaining capacity of the battery.

At step 93, the method periodically updates a remaining run-time value based on the remaining capacity value and the present discharge rate of the battery. Thus, the remaining run-time value is a prediction of the remaining battery life based on the present battery capacity, assuming that the present discharge rate remains constant.

During step 94, the method determines whether the remaining capacity value is less than the capacity alarm value. If so, the method proceeds to step 96 where the smart battery sends a capacity alarm signal to the system host, warning of low battery capacity. If not, the method proceeds to step 95.

At step 95, the method determines whether the remaining run-time value is less than the run-time alarm value. If so, the method proceeds to step 97 where the smart battery sends a run-time alarm signal to the system host. If not, the method returns to step 92 to again update the remaining capacity value.

After either step 96 (sending a capacity alarm signal) or step 97 (sending a run-time alarm signal), the method jumps back to step 92 to update the remaining capacity value again.

Figure 7:
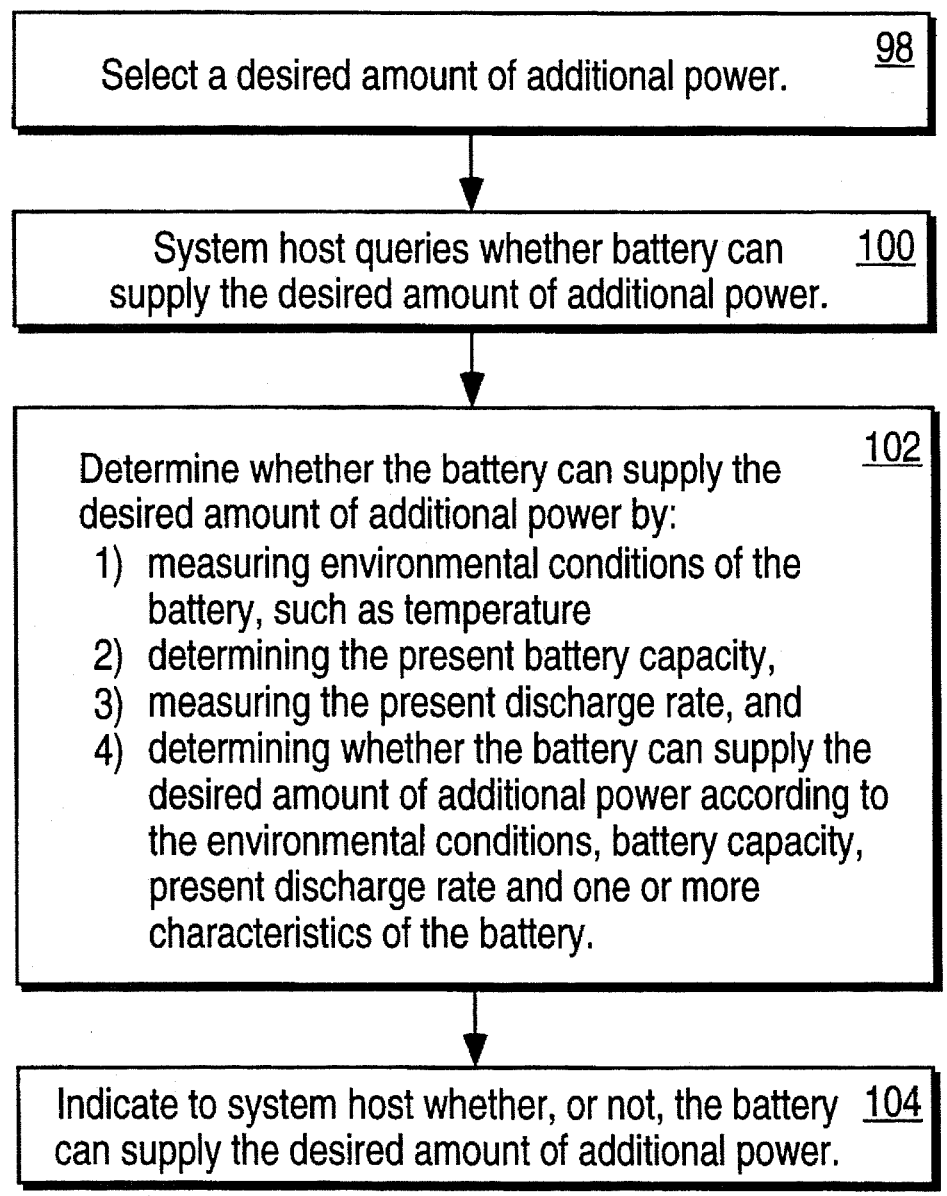
FIG. 7 is a flowchart of the present invention method for indicating whether a battery can provide a desired additional amount of power.

FIG. 7 illustrates a flowchart for the present invention method for determining whether a battery can supply a desired amount of power. At step 98, a desired amount of power is selected, Alternatively, an amount of power in addition to that presently provided may be selected (i.e., a desired amount of additional power). At step 100, the system host queries the battery whether the battery can supply the desired amount of power. At step 102, the battery determines whether it can supply the desired amount of power by: 1) measuring the environmental conditions of the battery, 2) determining the present battery capacity, preferably by the method shown in FIG. 6, 3) measuring the present discharge rate of the battery, and 4) determining whether the battery can supply the desired amount of power according to the measured conditions, present battery capacity, present discharge rate, and one or more characteristics of the battery. For example, the characteristic of FIG. 5A illustrates the effect of changing the discharge current on the battery capacity. The characteristic of FIG. 5B shows the effect of temperature and battery current on battery capacity.

At step 104, the battery indicates to the system host whether, or not, the battery can supply the desired amount of power.

Figure 8:
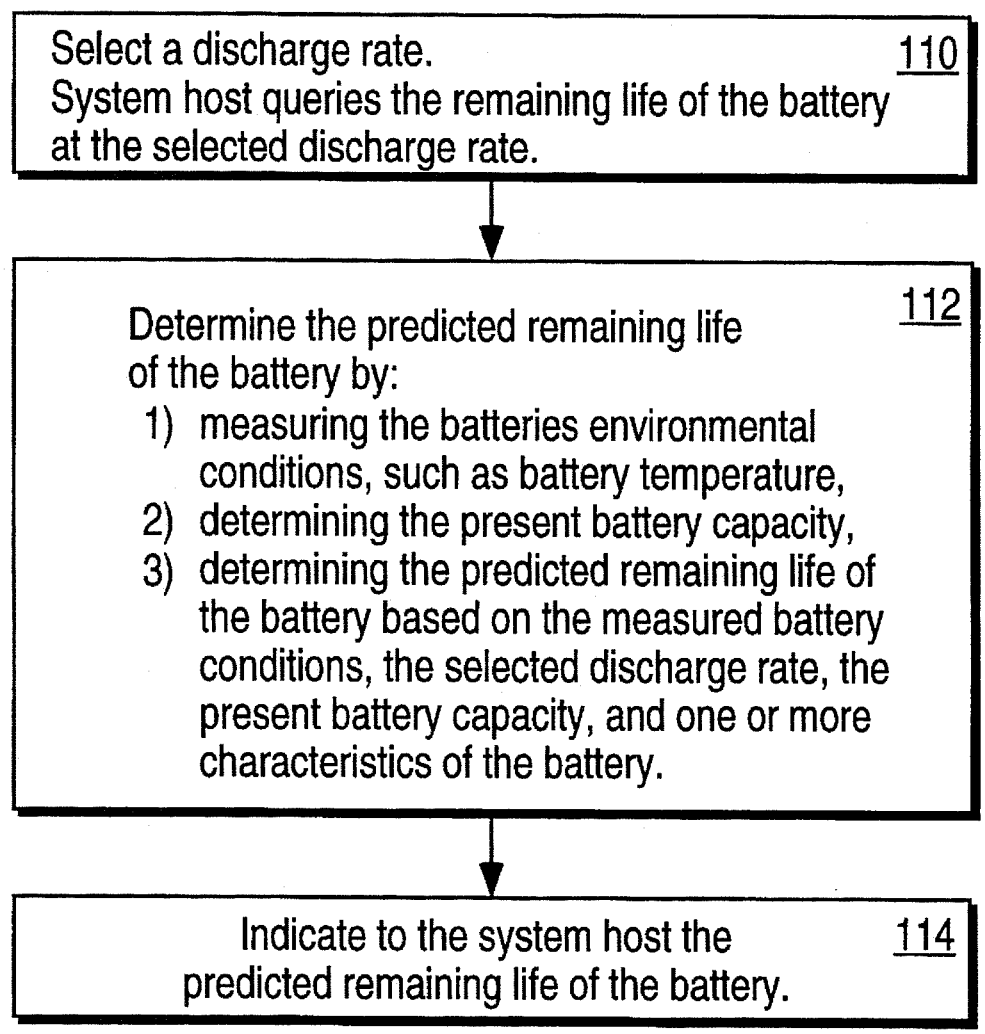
FIG. 8 is a flowchart of the present invention method for predicting the remaining life of a battery based on a user-defined discharge rate.

FIG. 8 is a flowchart illustrating the present invention method for predicting the remaining life of a battery based on a selected discharge rate. For example, the power management system in a computer may provide the following options to a user:

| User Selects | Expected System Discharge Rate |
| --- | --- |
| High Performance | 1000 mA |
| Medium Performance | 700 mA |
| Conserve Power | 300 mA |
| Select a Rate | <enter rate> |

These represent user-selectable performance/power options available to the user. However, what the user may really be interested in is whether the battery will survive his two hour airline flight. The indicated discharge rates for the various performance levels may be determined by a power management system such that they are a reasonably accurate indication of actual discharge. If the user selects the "High Performance" option the present invention battery life prediction method may predict a predicted battery life of 90 minutes. Selecting the "Medium Performance" option may predict a battery life of 2 hours and 5 minutes. Selecting the "Conserve Power" option may indicate a predicted battery life of 5 hours. If the "Select a Rate" option is selected, the user can enter a custom discharge rate and the power management system will attempt to manage the system's power consumption accordingly. Thus, predicted battery life based on user-defined discharge rates allows the user to determine which performance/power option best matches his present needs.

Turning to the present invention battery life prediction method, at step 110 a discharge rate is selected. The discharge rate may be selected by a user, a power management system, or by other means. The system host queries the battery for the estimated remaining life of the battery at the selected discharge rate.

At step 112, the method determines the predicted life of the battery by: 1) measuring the battery's environmental conditions, such as battery temperature, 2) determining present battery capacity, preferably by the method of FIG. 6, and 3) determining the predicted remaining life of the battery based on the measured battery conditions, the present battery capacity, the selected discharge rate, and one or more characteristics of the battery. For example, the characteristics of FIG. 5A and FIG. 5B may be used.

At step 114, the battery returns the predicted remaining life of the battery to the system host via the SMBus.

Figure 9:
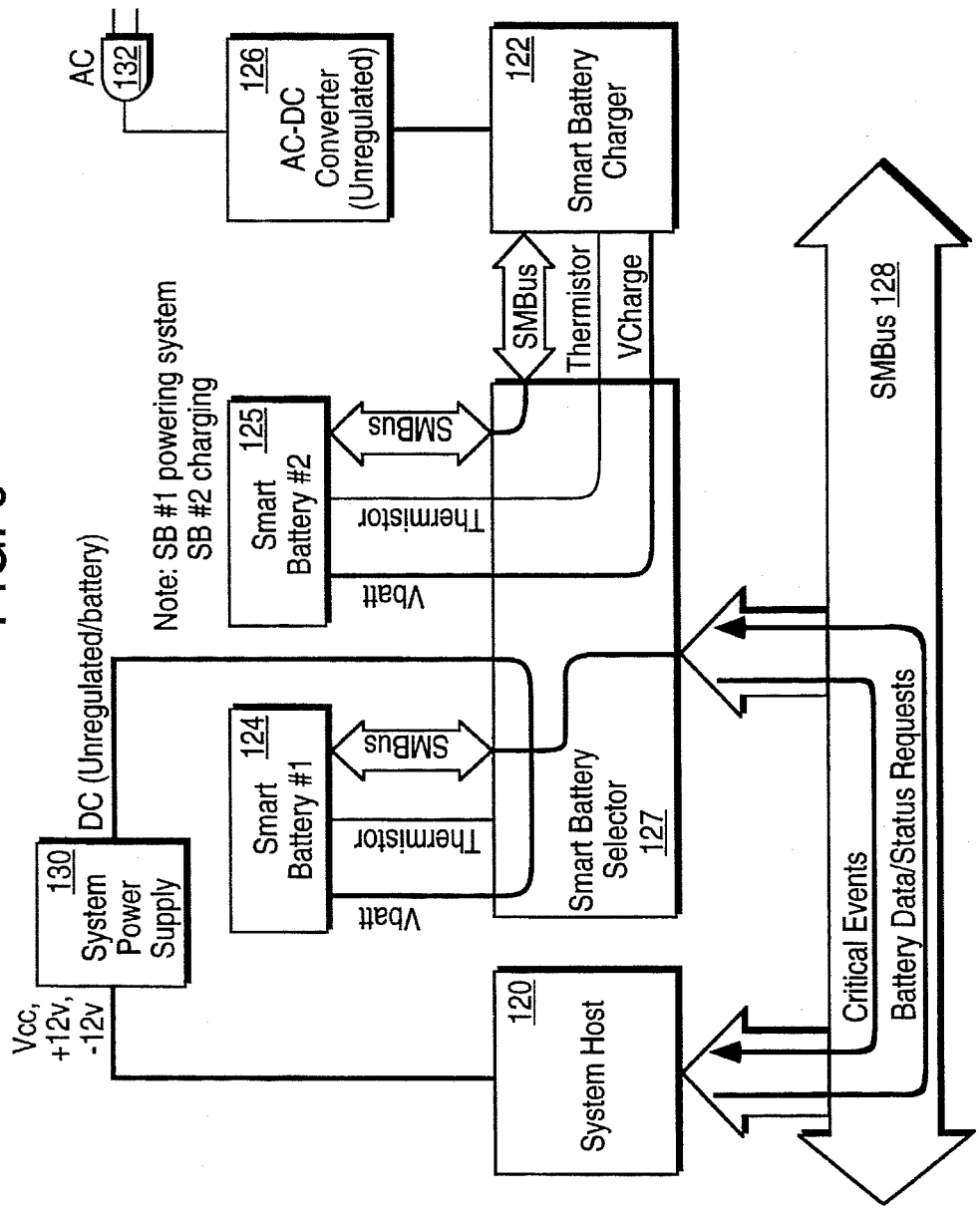
FIG. 9 is a block diagram of a smart battery system using one or more smart batteries.

FIG. 9 illustrates a smart battery system that includes two smart batteries, smart battery #1 124 and smart battery #2 125. A smart battery selector 127 connects the smart batteries to either smart battery charger 122, system host 120, or disconnects them, as appropriate. Smart battery #1 124 is powering the system. Smart battery #2 125 is being charged by the smart battery charger 122.

Figure 10:
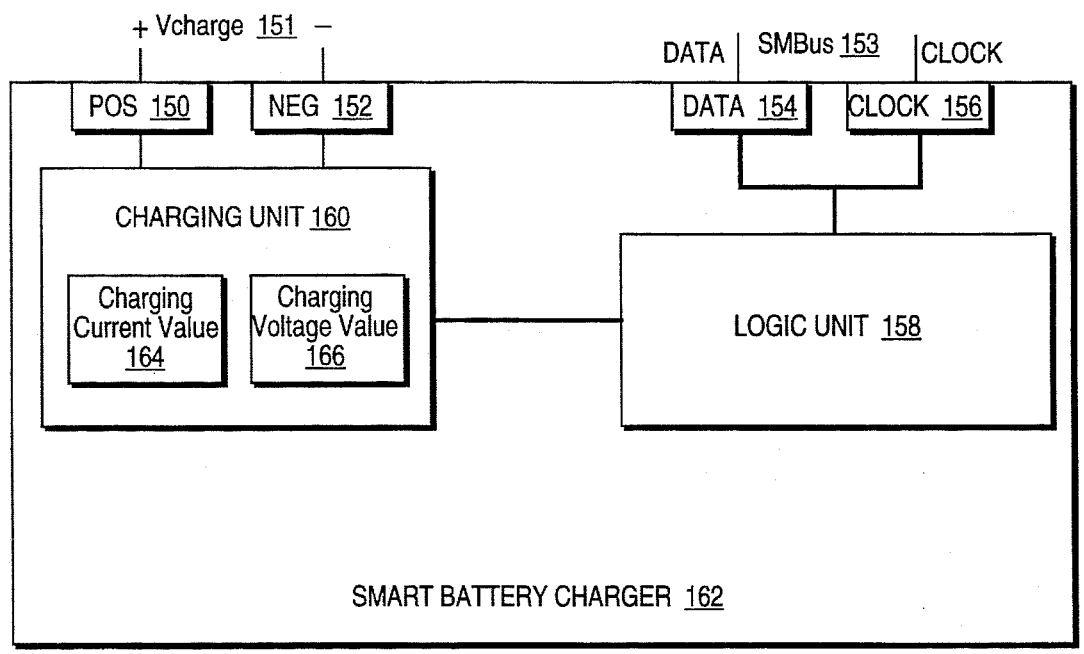
FIG. 10 is a block diagram of a smart battery charger.

FIG. 10 is a block diagram of one embodiment of a smart battery charger of the present invention. A smart battery charger 162 includes DATA 154 and CLOCK 156 terminals that allow communication with other components of a smart battery system via the DATA and CLOCK lines of the SMBus 153. A logic unit 158 performs the communication functions of the smart battery charger 162. A charging unit 160 generates a charging voltage and a charging current at POSitive 150 and NEGative 152 terminals of the smart battery charger 162 in response to a charging current value 164 and a charging voltage value 166 stored in the smart battery charger 162. The charging current value 164 and/or the charging voltage value 166 may be limits, rather than absolute values. The POS 150 and NEG 152 terminals are connected to the corresponding terminals of the smart battery being charged. The charging current value 164 and charging voltage value 166 are programmable by other SMBus devices of the system via the SMBus 153. In other words, logic unit 158 programs the values according to commands received via the SMBus 153. In one embodiment, charging unit 160 is not required to output precisely the charging current and charging voltage indicated by the charging current value 164 and charging voltage value 166, respectively. In this embodiment, the smart battery is responsible for precisely controlling the charging current and charging voltage. However, for reliable operation the charging unit 160 should respond monotonically to increases or decreases in the charging values. In another embodiment, the charging unit 160 includes sensors and feedback circuitry to output precisely the charging current and charging voltage indicated by the charging current value 164 and charging voltage value 166, respectively.

Refer now to FIG. 3 to further discuss the operation of a smart battery charger in a smart battery system. The electrical characteristics of smart battery charger 32 feature charging characteristics that are controlled by the smart battery itself, in contrast to a charger with fixed charging characteristics that is designed to charge only one particular cell type. The smart battery and smart battery charger combination provide two distinct advantages in system performance and cost. First, charging characteristics are integral to the battery itself, allowing for ideal charging algorithms that match the specific cell types. Each smart battery defines the charging scheme that is best suited to its chemistry, cell construction and capacity. Charging can be tailored to maximize the usable energy at each charge, reduce the charge time, and/or maximize the number of charge cycles. Second, the cost and complexity of the system can be reduced as the charger need only provide the charging voltage and current specified by the Smart Battery, without duplicating the measurement and control electronics already present in the smart battery. For example, in a system where the smart battery indicates the desired charging voltage and charging current to the smart battery charger 32, the smart battery charger 32 may not be required to measure or precisely control the voltage and current outputs. In such a feedback system, the smart battery can perform all of the measurement and control functions to cause the smart battery charger 32 to provide the desired voltage and current. The smart battery charger 32 is only required to respond monotonically to the signals from the smart battery 34.

Smart battery charger 32 may be defined in three levels: Level 1, Level 2 and Level 3. Each has a particular set of characteristics and minimum command set. At all levels, the smart battery charger 32 is able to communicate with the smart battery using the SMBus 38. The difference is the ability of the smart battery charger 32 to provide charging services to the smart battery 34. Level 2 chargers support all Level 1 commands. Level 3 chargers support all Level 1 and Level 2 commands.

A Level 1 smart battery charger 32 operates with a fixed charging algorithm and only interprets the smart battery's 34 critical warning messages that indicate that the battery should no longer be charged or discharged. It is not able to adjust its output in response to requests from the smart battery or the system host. The Level 1 charger is therefore not chemistry independent and is of limited utility in applications where multiple chemistries are expected. The Level 1 charger may use a smart battery's thermistor to determine if a Ni-Cd/Ni-MH or some other type battery chemistry which tolerates a constant current charge is present. When the thermistor is not present or exhibits a very low value (e.g., less than 500 Ω), the Level 1 charger will refuse to output any charge. This is a safety precaution that may be supported by all levels of smart battery chargers.

A Level 2 smart battery charger 32 not only interprets the smart battery's 34 critical warning messages, but is an SMBus slave device that responds to charging voltage and charging current messages sent to it by the smart battery 34 by dynamically adjusting its charging outputs. Smart battery 34 is in the best position to tell smart battery charger 32 how it can best be charged. The charging algorithm in the battery may simply request a charge condition once or may choose to periodically adjust the smart battery charger's 32 output to meet its present needs. The smart battery 34 may also send a pattern of charging information for a portion of (e.g., burst or pulse) or a complete charge cycle to smart battery charger 32. The Level 2 smart battery charger 32 is truly chemistry independent.

A Level 3 smart battery charger 32 not only interprets the smart battery's 34 critical warning messages, but is a SMBus master device. It may poll the smart battery 34 to determine the charging voltage and current the battery desires. The Level 3 charger 32 then dynamically adjusts its output to meet the battery's charging requirements. The smart battery 34 is in the best position to tell the smart battery charger 32 how it wants to be charged. Using the charging algorithm in the battery, the Level 3 charger may simply set a charge condition once or may choose to periodically adjust the charger's 32 output to meet the changing needs of the Smart Battery 34. A Level 3 smart battery charger is free to implement an alternative specialized charging algorithm (e.g. a medical device may have a stricter temperature limit than the Smart Battery's self-contained charging algorithm, a Level 3 charger could factor in the battery's reported temperature along with the charging current and voltage into its charging algorithm). Like the Level 2 charger, Level 3 smart battery charger is also chemistry independent. A Level 3 smart battery charger may also interrogate the smart battery 34 for other relevant data, such as time remaining to full charge, battery temperature or other data used to control proper charging or discharge conditioning.

Communication between the smart battery 34 and the smart battery charger 32 may be initiated by the battery or the charger depending upon the specific implementation, but the same information is transmitted from the battery to the charger, regardless of which device initiated the transaction. For example, a Level 3 charger may poll the battery periodically to determine the appropriate charge voltage and current, while a Level 2 charger must wait for the battery to initiate the data transmission. In both cases, data is supplied by the battery to the charger. Communications between smart battery 34 and smart battery charger 32 are performed: to allow the smart battery 34 to instruct the smart battery charger 3 2 to set the appropriate charge current and charge voltage, to allow access to the "correct" charge algorithm for the battery, to allow smart batteries to be charged as rapidly and as safely as possible, and to allow new and different battery technologies to be used.

Figure 11A:
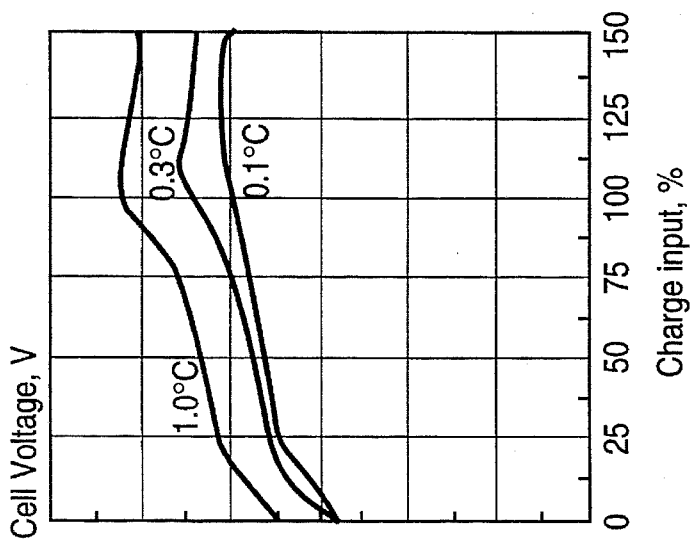
FIG. 11A is a graph illustrating the −dV/dt (voltage decrease) at end-of-charge for particular Ni-Cd and Ni-MH batteries.
Figure 11B:
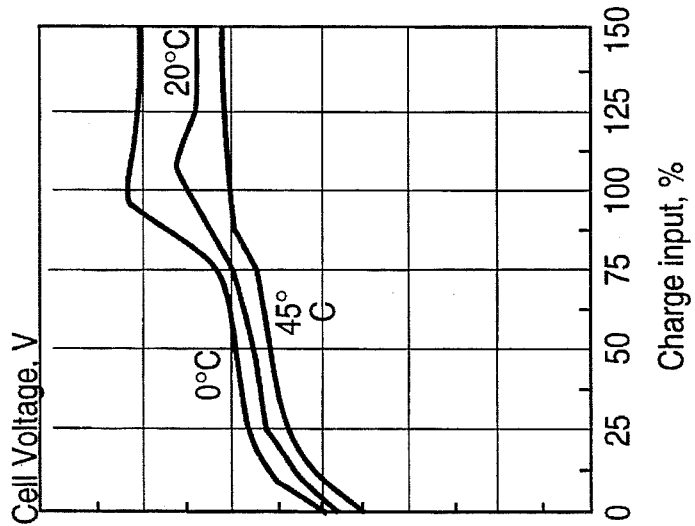
FIG. 11B is a graph illustrating a particular battery's charging characteristic for different temperatures.
Figure 11C:
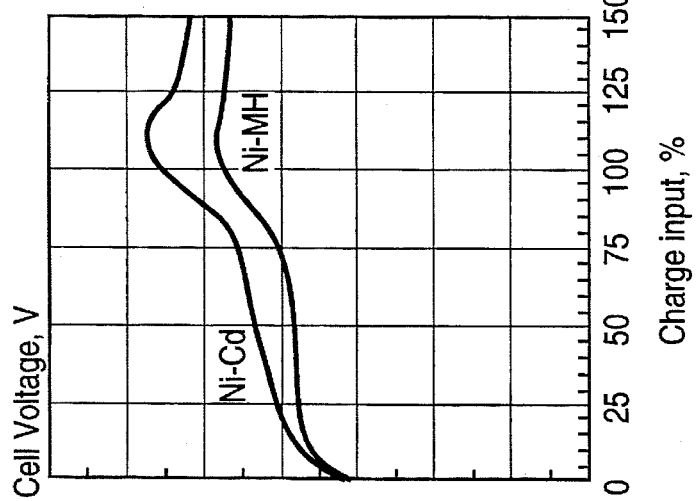
FIG. 11C is a graph illustrating a particular battery's charging characteristics for different charging currents.

Turning now to battery charging characteristics, FIG. 11A is a graph illustrating the –dV/dt (voltage decrease) at end-of-charge for typical Ni-Cd and Ni-MH batteries. FIG. 11B is an exemplary graph illustrating a battery's charging characteristic for temperatures of 0° C., 20° C., and 45° C. The graph shows that higher temperature decreases the voltage at end-of-charge. FIG. 11C is a graph illustrating a typical battery's charging characteristics for charging currents of 0.1 C, 0.3 C, and 1.0 C. The graph shows that a higher charging current increases the charging voltage. Using such charging characteristics, the smart battery can tell a smart battery charger the optimal charging current and charging voltage for charging under any present capacity and environmental conditions of the battery.

Figure 12:
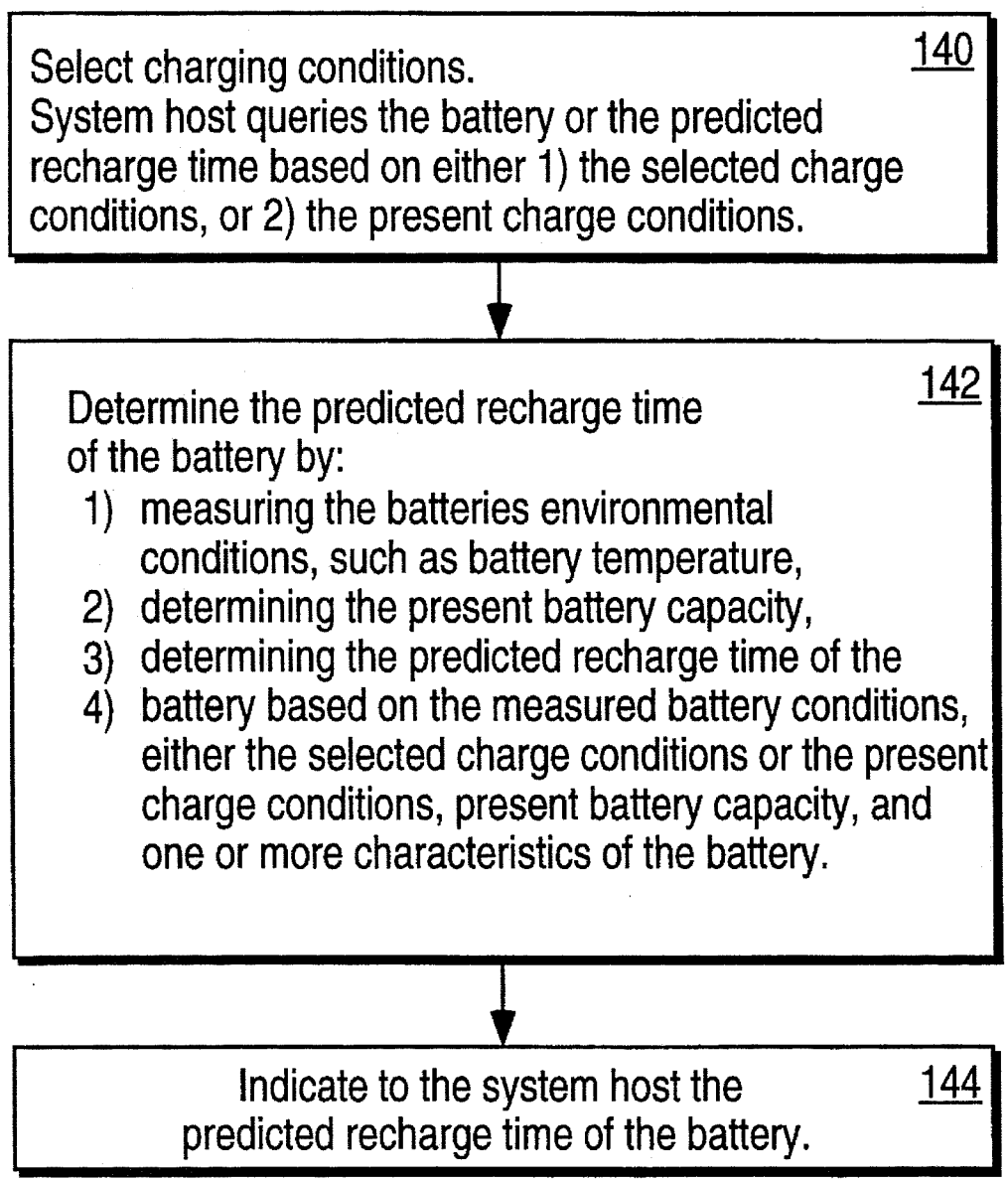
FIG. 12 is a flowchart illustrating the present invention method for predicting the recharge time of a battery.

FIG. 12 is a flowchart illustrating the present invention method for predicting the recharge time of a battery. For example, the power management system in a computer may provide the following charging options to a user:

| User Selects | System Uses a Charge Rate of: |
| --- | --- |
| Quick Charge | 1000 mA |
| Medium Charge | 300 mA |
| Conserve Battery Life | 100 mA |
| Select a Charge Rate | <enter a charge rate> |

These represent user-selectable recharge condition options available to the user. However, what the user may really be interested in is whether her battery can be recharged before a critical meeting in 45 minutes. If the user selects the "Quick Charge" option the present invention recharge time prediction method may predict a recharge time of 30 minutes based on present battery capacity. The user may also be informed that a Quick Charge has a significantly larger impact on shortening the battery's life than other options. Selecting the "Medium Charge" option may predict a recharge time of 60 minutes. Selecting the "Conserve Battery Life" option may predict a recharge time of 2 hours. If the "Select a Charge Rate" option is selected, the user can enter a custom charge rate. Alternatively, the user can select a custom charge time. Thus, predicted battery recharge time based on user-defined charge rates allows the user to determine the charge rate option that best matches his present needs.

Turning to the present invention method for predicting the recharge time of a battery, at step 140 a charge rate is selected. The charge rate may be selected by a user, a power management system, or by other means. Alternatively, a default charge rate (such as the present charge rate) may be selected. The system host queries the battery for the predicted battery recharge time based on either the present charge conditions or the selected charge rate.

At step 142, the method determines the predicted battery recharge time by: 1) measuring the battery's environmental conditions, such as battery temperature, 2) determining present battery capacity, preferably by the method of FIG. 6, and 3) determining the predicted recharge time of the battery based on the measured environmental conditions, the present battery capacity, either the present charge conditions or the selected charge rate, and one or more characteristics of the battery. For example, the charging characteristics of FIG. 11A, FIG. 11B, and FIG. 11C may be used.

At step 144, the battery indicates the predicted battery recharge time to the system host via the SMBus.

Thus, a smart battery that can predict whether or not the battery can provide a requested amount of additional power based on battery-specific characteristics has been described.

What is claimed is:

1. An apparatus for indicating whether or not a battery is capable of providing a requested amount of power, the apparatus comprising:
   a logic unit;
   a memory, coupled to the logic unit, which contains one or more characteristics of the battery and contains information indicative of environmental conditions of the battery, the battery characteristics including information indicative of a present capacity of the battery; and
   wherein the logic unit determines and indicates whether or not the battery can provide the requested amount of power based on the environmental conditions, and the battery characteristics.

2. The apparatus of claim 1 wherein the requested amount of power is in addition to an existing amount of power being supplied by the battery and the logic unit determines whether the battery can provide the requested amount of additional power based on a present charge/discharge rate of the battery, the environmental conditions, and the battery characteristics.

3. The apparatus of claim 1 wherein the environmental conditions include temperature, humidity, and air pressure and the battery characteristics include one or more discharge characteristics and one or more capacity characteristics.

4. The apparatus of claim 1 wherein the environmental conditions include a temperature of the battery and the battery characteristics include a discharge characteristic and a capacity characteristic, each characteristic a function of battery temperature.

5. The apparatus of claim 4 wherein the logic unit determines the present battery capacity based on a self-discharge characteristic and the temperature of the battery.

6. The apparatus of claim 5 wherein the requested amount of additional power is selected by a user.

7. The apparatus of claim 6 wherein the apparatus for indicating whether a battery is capable of providing a requested amount of power is embedded in the battery.

8. The apparatus of claim 1 wherein the battery characteristics are stored in the form of either a table or an algorithm.

9. An apparatus for indicating whether or not a battery is capable of providing a requested amount of additional power, the apparatus comprising:
   a logic unit;
   a capacity circuit for indicating the present capacity of the battery;
   a current measuring circuit, coupled to the logic unit, for measuring a battery current;
   an environmental monitor circuit, coupled to the logic unit, for monitoring one or more environmental conditions of the battery;
   a memory, coupled to the logic unit, actually storing one or more characteristics of the battery, and actually storing information indicative of environmental conditions of the battery, the battery characteristics including information indicative of the present capacity of the battery; and
   wherein the logic unit determines whether or not the battery can provide the requested amount of additional power based on the measured environmental conditions, and the battery characteristics.

10. The apparatus of claim 9 wherein the apparatus for indicating whether the battery is capable of providing a requested amount of additional power is embedded in the battery.

11. A method for operating a battery, the method comprising the steps of:
   querying the battery whether it can provide a requested amount of power;
   the battery predicting whether or not the battery can provide the requested amount of power based on one or more environmental conditions of the battery, and one or more characteristics of the battery, the battery characteristics including a present capacity of the battery; and
   the battery indicating whether or not the battery can provide the requested amount of power.

12. The method of claim 11 wherein the environmental conditions include temperature, humidity, and air pressure and the battery characteristics include one or more discharge characteristics and one or more capacity characteristics.

13. The method of claim 11 further comprising the step of selecting the additional amount of power.

14. A method for operating a battery, the method comprising the steps of:
   querying the battery whether it can provide an additional amount of power;
   the battery predicting whether or not the battery can provide the requested amount of power based on a present charge/discharge rate of the battery, one or more environmental conditions of the battery, and one or more characteristics of the battery, the battery characteristics including a present capacity of the battery; and
   the battery indicating whether or not the battery can provide the additional amount of power.

15. The method of claim 14 wherein the environmental conditions include temperature, humidity, and air pressure and the battery characteristics include one or more discharge characteristics and one or more capacity characteristics.

16. The method of claim 14 further comprising the step of selecting the additional amount of power.

17. The method of claim 14 further comprising the steps of:
   determining the battery capacity based on the battery current, a self-discharge characteristic, and one or more of the environmental conditions; and
   measuring the present charge/discharge rate of the battery.

18. A method for indicating whether or not a battery is capable of providing a requested amount of power, the method comprising the steps of:

providing a logic unit;

providing a memory storing one or more characteristics of the battery, and one or more environmental conditions of the battery;

determining a present capacity of the battery; and the logic unit determining whether or not the battery can provide the requested amount of power based on the present capacity of the battery, the environmental conditions, and the battery characteristics.

19. The method of claim 18 wherein the requested amount of power is in addition to an existing amount of power being supplied by the battery at a present charge/discharge rate, and the logic unit determines whether the battery can provide the requested amount of additional power based also on the present charge/discharge rate.

20. The method of claim 18 wherein the environmental conditions include a temperature of the battery and the battery characteristics include a discharge characteristic and a capacity characteristic as a function of battery temperature.

21. The method of claim 20 wherein the logic unit determines the present battery capacity based on a self-discharge characteristic and the temperature of the battery.

22. The method of claim 21 further comprising the step of selecting the requested amount of additional power.

23. A method for operating a battery, the method comprising the steps of:

providing a logic unit coupled to the battery;

querying the logic unit whether or not the battery can provide an additional amount of power;

measuring a present charge/discharge rate of the battery;

measuring one or more environmental conditions of the battery;

determining a present capacity of the battery based on one or more of the environmental conditions and one or more characteristics of the battery, the battery characteristics being functions of the present charge/discharge rate; and the logic unit determining whether or not the battery can supply the additional amount of power based on the environmental conditions, the present battery capacity, the present discharge rate, and the battery characteristics.

24. The method of claim 23 wherein the environmental conditions include a temperature of the battery, and the battery characteristics include battery capacity as a function of temperature and present charge/discharge rate.

25. The apparatus of claim 1 wherein the battery characteristics include a measurement of battery current.

26. The apparatus of claim 9 wherein the battery characteristics include a measurement of battery current.

27. The method of claim 11 wherein the battery characteristics include a battery current.

28. The method of claim 18 wherein the characteristics of the battery include a battery current.

29. An apparatus for indicating whether or not a battery is capable of providing a requested amount of power, the apparatus comprising:

a memory, coupled to a logic unit, the memory containing one or more environmental conditions and a present capacity of the battery;

the logic unit determining and indicating whether or not the battery can provide the requested amount of power based on the environmental conditions and the present capacity of the battery.

30. The apparatus of claim 29 wherein the logic unit determines the present battery capacity based on a self-discharge characteristic and the temperature of the battery.

31. The apparatus of claim 29 wherein the requested amount of power is in addition to an existing amount of power being supplied by the battery.

32. The apparatus of claim 29 wherein the environmental conditions include temperature, humidity and air pressure.

* * * * *

UNITED STATES PATENT AND TRADEMARK OFFICE
CERTIFICATE OF CORRECTION

| | | |
|---|---|---|
| PATENT NO. | : | 5,541,489 |
| DATED | : | July 30, 1996 |
| INVENTOR(S) | : | Robert A. Dunstan |

It is certified that error appears in the above-identified patent and that said Letters Patent is hereby corrected as shown below:

In column 2 at lines 15-16 delete "ran-time" and insert --run-time--

In column 2 at line 57 delete "rim-time" and insert --run-time--

In column 3 at line 39 delete "riser" and insert --user--

In column 6 at line 24 delete "warns" and insert --wants--

In column 6 at line 60 delete "frown" and insert --from--

In column 8 at line 1 delete "spiraling" and insert --spinning--

In column 11 at line 11 delete "selected," and insert --selected.--

Signed and Sealed this

Twenty-sixth Day of November 1996

Attest:

BRUCE LEHMAN

Attesting Officer     Commissioner of Patents and Trademarks